United States Patent [19]
Miwa

[11] Patent Number: 5,821,792
[45] Date of Patent: Oct. 13, 1998

[54] CURRENT DIFFERENTIAL AMPLIFIER CIRCUIT

[75] Inventor: Tohru Miwa, Tokyo, Japan

[73] Assignee: NEC Corporation, Tokyo, Japan

[21] Appl. No.: 723,550

[22] Filed: Sep. 30, 1996

[30] Foreign Application Priority Data

Sep. 29, 1995 [JP] Japan .................................. 7-277170

[51] Int. Cl.⁶ .............................. G11C 7/06; H03K 3/356
[52] U.S. Cl. ............................... 327/215; 327/55; 327/57
[58] Field of Search ............................. 365/205; 327/57, 327/55, 53, 52, 215, 54

[56] References Cited

U.S. PATENT DOCUMENTS

| | | | |
|---|---|---|---|
| 4,551,641 | 11/1985 | Pelley, III .................................. | 327/55 |
| 4,843,264 | 6/1989 | Galbraith .................................. | 327/55 |
| 5,438,543 | 8/1995 | Yoon ..................................... | 365/207 |
| 5,440,506 | 8/1995 | Longway et al. ......................... | 365/207 |
| 5,563,834 | 10/1996 | Longway et al. ......................... | 365/203 |
| 5,604,705 | 2/1997 | Ackland et al. .......................... | 365/205 |
| 5,615,161 | 3/1997 | Mu .......................................... | 327/57 |

FOREIGN PATENT DOCUMENTS

| | | | |
|---|---|---|---|
| 59-132491 | 7/1984 | Japan .............................. | G11C 11/34 |
| 60-227511 | 11/1985 | Japan .............................. | H03K 3/356 |
| 3-95794 | 4/1991 | Japan .............................. | G11C 11/409 |

OTHER PUBLICATIONS

Baker et al, "A 3.3V 16 Mb Flash Memory with Advanced Write Automation", IEEE, ISSCC Slide Supplement, 1994, pp. 112–113, 276.

*Primary Examiner*—Timothy P. Callahan
*Assistant Examiner*—Terry L. Englund
*Attorney, Agent, or Firm*—Foley & Lardner

[57] ABSTRACT

A current differential amplifier circuit comprises first and second pMOS transistors (P11 and P12) connected between a power supply and a first node (W11); third and fourth pMOS transistors (P13 and P14) connected between the power supply and a second node (W12); a fifth pMOS transistor (P15) connected between gates of the second and the third pMOS transistors (P12 and P13), each of the gates connected to its opposite node (W11 or W12); a first nMOS transistor (N16) connected between the first node (W11) and a first current source (I11) and having its gate connected to the second node (W12); and a second nMOS transistor (N17) connected between the second node (W12) and a second current source (I12) and having its gate connected to the first node (W11). Pre-charge signal (/PC) is applied to the gates of the first, fourth and the fifth pMOS transistors (P11, P14 and P15) and comparison results are derived from either the first node (W11) or the second node (W12).

3 Claims, 2 Drawing Sheets

P11~P15 : pMOS
N16, N17 : nMOS
W11, W12 : NODE
I11, I12 : CURRENT SOURCE
/PC : PRE-CHARGE SIGNAL

LTCH : LATCH SIGNAL

P11~P15 : pMOS
W11,W12 : NODE
I11,I12 : CURRENT SOURCE
/PC : PRE-CHARGE SIGNAL

CURRENT DIFFERENTIAL AMPLIFIER CIRCUIT

BACKGROUND OF THE INVENTION

The present invention relates to a current differential amplifier circuit for making a comparison in magnitude between two electric currents, and more particularly to a current differential amplifier circuit allowing the output to be fully swung between a power supply voltage level and a ground level as well as enabling the detection results to be held after the comparison.

In a storage device such as a UVEPROM, a flash memory and the like, a sense amplifier circuit is generally used to compare the magnitude of current flowing between the source and drain of a selected memory cell transistor with that of a reference current, for reading and outputting information stored within the memory cell. This type of sense amplifier usually consists of a combination of a current-voltage converter circuit and a voltage differential amplifier circuit. The current flowing through the memory cell transistor is converted by the current-voltage converter circuit into a voltage, and then compared by the voltage differential amplifier circuit with a reference voltage similarly obtained from a reference current, the comparison results thereof being amplified for output.

In order to implement a more rapid read-out action, a current differential amplifier circuit is used, in recent years, in place of the sense amplifier circuit described above, wherein the memory cell current and the reference current are both directly fed into the current differential amplifier circuit to be compared in magnitude.

As to the prior art, FIG. 3, depicts a current differential amplifier circuit, by way of example, proposed in IEEE INTERNATIONAL SOLIDSTATE CIRCUIT SLIDE SUPPLEMENT, 1994, pp. 112 to 113 and 276, entitled "A 3.3V 16Mb Flash Memory with Advanced Write Automation".

In FIG. 3, two pairs of p-channel MOS transistors (hereinafter referred to as pMOSs) P11, P12 and P13, P14 are connected in parallel respectively, with both of their coupled sources connected to a power supply and each of their coupled drains connected to nodes W11 and W12, respectively. A pMOS P15 is provided between two gates of the pMOSs P12 and P13, with each of the two gates connected crosswise to its opposite node W12 and W11, respectively. Two current sources I11 and I12 are connected to the nodes W11 and W12 in such a manner that their currents, that are to be compared relative to each other, can flow through the nodes W11 and W12, respectively. An inverter NOT is connected with the node W12 for supplying the detection output therefrom.

In this conventional current differential amplifier circuit, a low-level of a pre-charge signal /PC ('/' designates negative logic) is first applied to the gates of the pMOSs P11, P14 and P15 to activate the pMOSs P11, P14 and P15. This is done so that the nodes W11 and W12 are pre-charged with a power supply voltage to equalize the two nodes W11 and W12 at the same potential. Then, the pre-charge signal /PC is turned to a high-level and the pMOSs P11, P14 and P15 turn OFF. The result is that the potentials at the nodes W11 and W12 are both lowered because of currents flowing through the current sources I11 and I12, respectively. At that time, with the pMOS P15 being OFF, the gates of the pMOSs P12 and P13 are subject to the potentials of the oppositely disposed nodes W12 and W11, respectively. Therefore, the pMOSs P12 and P13, constituting a positive feedback circuit, amplify the difference in currents flowing through the current sources I11 and I12. This ensures a lower potential at the node connected to the current source that is flowing more current than the other current source.

Thus, a low level output is obtained when the current that is flowing through the current source I11 is larger than that flowing through the current source I12. This is because the output of the current differential amplifier provides an inverted potential of the node W12 through an inverter NOT, whereas it provides a high level when the current flowing through the current source I12 is larger than that flowing through the current source I11.

In this conventional current differential amplifier circuit, however, the potentials at the nodes W11 and W12 can not fully swing between ground level and the power supply voltage. This is because the potentials at the nodes W11 and W12 in the detection mode are merely lowered according to the currents flowing through the current sources I11 and I12, and the pMOSs P12 and P13, selected to have small parasitic capacitance for ensuring high-speed operation, may not supply sufficient current against the current sources. Another result is that the voltage level output from the inverter NOT cannot fully swing.

Therefore, it is necessary to fully amplify the voltage level at the inverter NOT itself or after the signal passes through the inverter.

Furthermore, with the input not fully swung, a through current is wasted in the inverter NOT following the current differential amplifier.

Still further, if the current sources I11 and I12 are cut from the current differential amplifier, for suppressing current consumption after the detection, both of the potential levels at the nodes W11 and W12 return to that of the power supply voltage (minus the threshold voltage of the pMOS), destroying the detection results.

These are problems to watch the present invention is addressed.

SUMMARY OF THE INVENTION

A primary object of the invention is to provide a current differential amplifier circuit wherein its detection output is fully swung for suppressing waste current flowing through its buffer circuit and the detection output can be sustained even if the current sources are cut off after the detection.

In order to achieve the object, a current differential amplifier circuit for effecting a comparison in magnitude between currents flowing through first and second current sources comprises:

first and second MOS transistors connected between a power supply and a first node, said first MOS transistor gated by a pre-charge signal and a gate of said second MOS transistor connected to a second node;

third and fourth MOS transistors connected between said power supply and said second node, said fourth MOS transistor gated by said pre-charge signal and a gate of said third MOS transistor connected to said first node;

a fifth MOS transistor gated by said precharge signal and connected between said first and said second nodes;

a sixth MOS transistor of polarity inverse to said first to said fifth MOS transistors connected between said first node and an end of the first current source, a gate of said sixth MOS transistor connected to said second node;

a seventh MOS transistor of polarity inverse to said first to said fifth MOS transistors connected between said second node and an end of the second current source, a gate of said seventh MOS transistor connected to said first node;

an eighth MOS transistor gated by a latch signal connected between a ground and said end of the first current source; and an ninth MOS transistor gated by said latch signal connected between said ground and said end of the second current source.

Therefore, the detection output of the current differential amplifier circuit can be fully swung and can be sustained even if the current sources are cut off after the detection.

BRIEF DESCRIPTION OF THE DRAWINGS

These and other objects, features and advantages of the present invention will become more apparent from the following detailed description thereof in conjunction with accompanying exemplary drawings, in which.

DETAILED DESCRIPTION OF THE PREFERRED EMBODIMENTS

Figure 1:
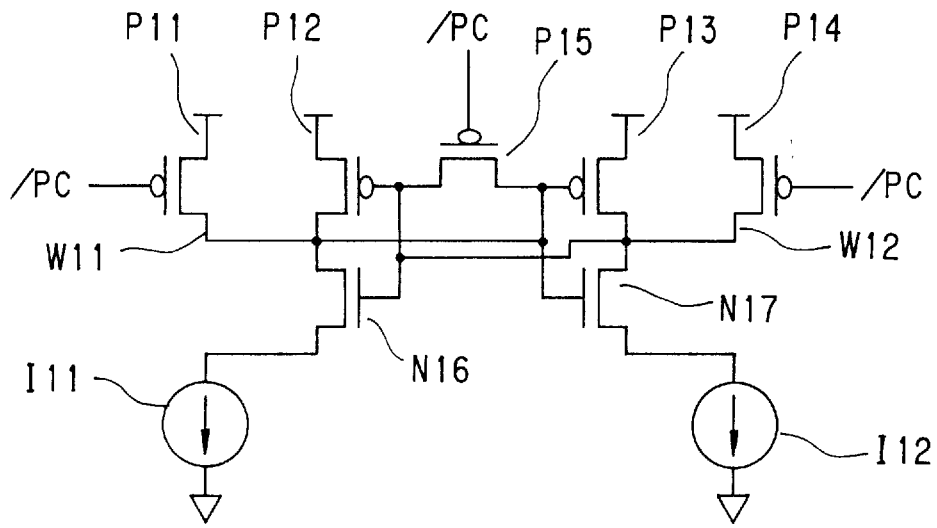
FIG. 1 is a circuit diagram illustrating a configuration of a current differential amplifier circuit of a first embodiment of the present invention.

Referring first to FIG. 1, there is depicted a circuit configuration of a first embodiment of the present invention, comprising n-channel MOS transistors (hereinafter referred to as nMOSs) N16 and N17 in addition to the conventional current differential amplifier shown in FIG. 3.

Figure 3:
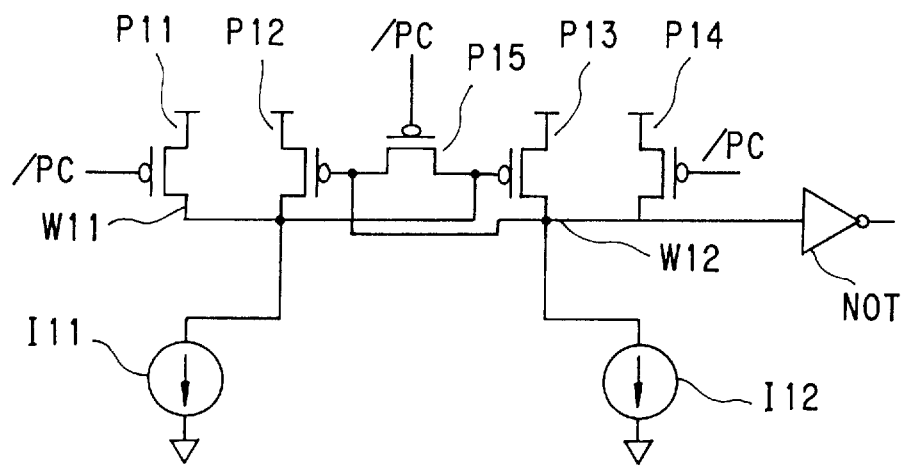
FIG. 3 is a circuit diagram illustrating, by way of example, a configuration of a conventional current differential amplifier circuit.

In both the conventional current differential amplifier of FIG. 3, and in the embodiment of FIG. 1, a low level pre-charge signal /PC is first applied to the gates of the pMOSs P11, P14 and P15 to activate them for pre-charging both of the nodes W11 and W12 with the power supply voltage. The pre-charge signal /PC is then turned to a high level to make the pMOSs P11, P14 and P15 OFF, and the potentials of the nodes W11 and W12 are lowered with currents flowing through the current sources I11 and I12 respectively, similarly to the conventional current differential amplifier of FIG. 3. But here in the embodiment of FIG. 1 when the potential of the node W12 is lowered at a faster rate than that of the node W11, because, for example the current flowing through the current source I12 is larger than that flowing through the current source I11, the nMOS N16 constituting the bistable multivibrator becomes OFF. This shifts the potential of the node W11 to the power supply voltage even if the ability of the pMOS P12 is comparatively small.

Thus, the detection output at the node W11 is fully swung to the power supply voltage, because the pMOS P12 and the nMOS N17 go to ON, and the pMOS P13 and the nMOS N16 go to OFF, when the current flow of the current source I12 is larger than that of the current source I11. Also, the detection output at the node W11 is fully swung to the ground level when the current flow of the current source I12 is smaller than that of the current source I11, because the pMOS P13 and the nMOS N16 go to ON, and the pMOS P12 and the nMOS N17 go to OFF.

Therefore, waste current is prevented from flowing through an inverter, for example, so as to buffer the output from the node W11, in the embodiment of FIG. 1.

Figure 2:
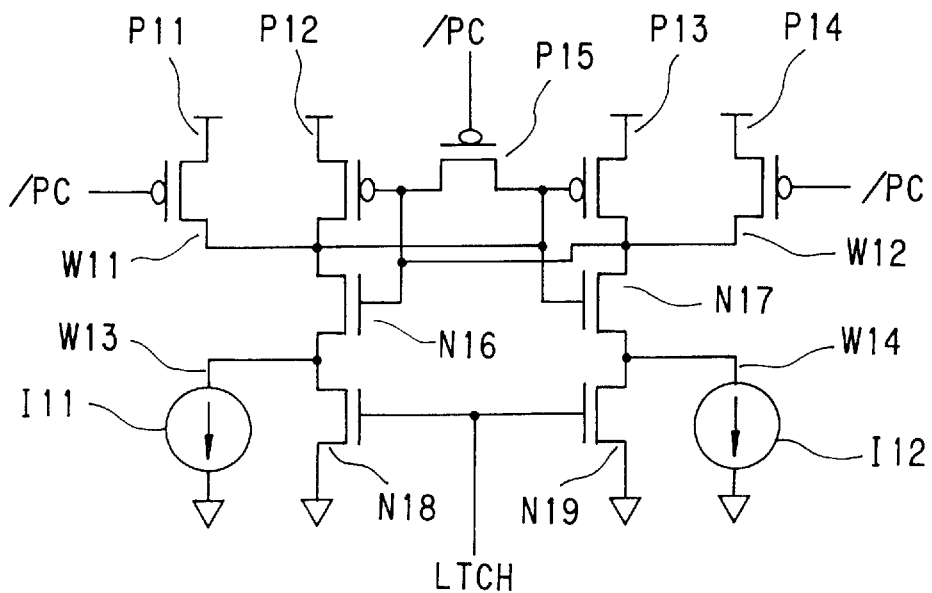
FIG. 2 is a circuit diagram illustrating a configuration of a current differential amplifier circuit of a second embodiment of the present invention.

Referring then to FIG. 2, there is depicted a circuit configuration of a second embodiment of the present invention, wherein the circuit of FIG. 2 is further comprised of nMOS transistors N18 and N19, in addition to the first embodiment of FIG. 1.

In the first embodiment, FIG. 1, the detection output can be fully swung, but, for example when the current sources I11 and I12 are cut off after the detection, potentials of both nodes W11 and W12 are shifted to the power supply voltage (minus pMOS's threshold voltage) and the detection output is destroyed in the same manner as in the conventional current amplifier of FIG. 3. This is because the bistable multivibrator composed of pMOSs P12 and P13, and the nMOS N16 and N17, is cut from the ground.

The nMOSs N18 and N19 of FIG. 2 are provided for maintaining the status of the bistable multivibrator even when the current sources I11 and I12 are cut therefrom after the detection. For this purpose, the drains of the nMOSs N18 and N19 are connected to the sources of the nMOS N16 and N17 in parallel to the current sources I11 and I12, respectively. The gates of the nMOSs N18 and N19 are controlled by a latch signal LTCH, which goes to a high level just after the current difference is detected until the pre-charge signal /PC returns to a low level for another detection. Therefore, the bistable multivibrator can maintain its status after detection, with the nMOSs N16 and N17 grounded through the nMOSs N18 and N19, even when the current sources I11 and I12 are cut off.

Thus, in the embodiment of FIG. 2, a current differential amplifier is provided, wherein the detection output can be fully swung preventing waste current from flowing through a following buffer circuit and can be maintained even if the current sources to be compared are cut off after the detection.

What is claimed is:

1. A current differential amplifier circuit for effecting a comparison in magnitude between currents flowing through first and second current sources, comprising:

first and second MOS transistors connected in parallel between a power supply and a first node, said first MOS transistor gated by a pre-charge signal and a gate of said second MOS transistor connected to a second node;

third and fourth MOS transistors connected in parallel between said power supply and said second node, said fourth MOS transistor gated by said pre-charge signal and a gate of said third MOS transistor connected to said first node;

a fifth MOS transistor gated by said pre-charge signal and connected between said first and said second nodes wherein the first to fifth MOS transistors are of the same polarity;

a sixth MOS transistor of polarity inverse to said first to said fifth MOS transistors connected directly between said first node and an end of the first current source, and a gate of said sixth MOS transistor connected to said second node;

a seventh MOS transistor of polarity inverse to said first to said fifth MOS transistors connected directly between said second node and an end of the second current source, and a gate of said seventh MOS transistor connected to said first node;

an eighth MOS transistor gated by a latch signal and connected between a ground and said end of the first current source; and a ninth MOS transistor gated by said latch signal and connected between said ground and said end of the second current source; and an output connected to at least one of said first and said second nodes.

2. A current differential amplifier circuit as recited in claim 1, wherein:

said first to said fifth MOS transistors comprise p-channel MOS transistors and said sixth and said seventh MOS transistors are n-channel MOS transistors.

3. A current differential amplifier circuit as recited in claim 1, wherein:

said first and said second current sources comprise a pair of bit lines connected to a memory cell for reading out information stored in said memory cell by a difference between current intensity flowing in each of said bit lines.

* * * * *